US012677434B2

(12) United States Patent
Tang

(10) Patent No.: US 12,677,434 B2
(45) Date of Patent: Jul. 7, 2026

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Poren Tang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 439 days.

(21) Appl. No.: 18/122,224

(22) Filed: Mar. 16, 2023

(65) Prior Publication Data

US 2023/0299189 A1 Sep. 21, 2023

(30) Foreign Application Priority Data

Mar. 18, 2022 (CN) .......................... 202210269792.7

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10P 14/20* | (2026.01) |
| *H10P 50/64* | (2026.01) |

(52) U.S. Cl.
CPC ........... *H10D 30/43* (2025.01); *H10D 30/014* (2025.01); *H10D 30/6735* (2025.01); *H10D 62/121* (2025.01); *H10D 64/017* (2025.01); *H10D 64/018* (2025.01); *H10P 14/3411* (2026.01); *H10P 14/3462* (2026.01); *H10P 50/642* (2026.01)

(58) Field of Classification Search
None
See application file for complete search history.

(56) References Cited

U.S. PATENT DOCUMENTS

| | | | |
|---|---|---|---|
| 10,243,054 B1 * | 3/2019 | Cheng .................... | H10D 84/83 |
| 2015/0069328 A1 * | 3/2015 | Leobandung ........ | H10D 62/116 |
| | | | 438/151 |

(Continued)

FOREIGN PATENT DOCUMENTS

CN 114078702 A 2/2022

*Primary Examiner* — Nicholas J Tobergte
(74) *Attorney, Agent, or Firm* — Anova Law Group, PLLC

(57) ABSTRACT

A semiconductor structure and its fabrication method are provided. The semiconductor structure includes: a substrate, composite layers, a gate structure crossing the composite layers; inner spacers, source/drain layers, and insulating layers. Each composite layer includes channel layers, first openings between the channel layers and the substrate, and second openings between adjacent channel layers. The gate structure is located on sidewalls and top surfaces of the composite layers, and is also located in the second openings and surrounds the channel layers. The inner spacers are located between adjacent channel layers, and between the channel layers and the substrates. The source/drain layers are located in the composite layers on two sides of the gate structure. Sidewalls of the source/drain layers are coplanar with the sidewalls of adjacent inner spacers and end faces of adjacent channel layers. The insulating layers are located in the first openings.

20 Claims, 14 Drawing Sheets

(56)　　　　　References Cited

U.S. PATENT DOCUMENTS

| | | | |
|---|---|---|---|
| 2016/0099338 A1* | 4/2016 | Chang | H10D 62/126 |
| | | | 438/157 |
| 2017/0005176 A1* | 1/2017 | Sung | H10D 62/121 |
| 2018/0114727 A1* | 4/2018 | Rodder | H10D 30/673 |
| 2020/0006559 A1* | 1/2020 | Mehandru | H10D 84/83 |
| 2020/0013900 A1* | 1/2020 | Carr | H01L 21/76865 |

* cited by examiner

X

103

102

104

105

101

A

200

1

SEMICONDUCTOR STRUCTURE AND FABRICATION METHOD THEREOF

CROSS-REFERENCE TO RELATED APPLICATION

This application claims the priority of Chinese Patent Application No. 202210269792.7, filed on Mar. 18, 2022, the content of which is incorporated herein by reference in its entirety.

TECHNICAL FIELD

The present disclosure generally relates to the field of semiconductor fabrication technology and, more particularly, relates to a semiconductor structure and its fabrication method.

BACKGROUND

In existing semiconductor technology, a fin field effect transistor (FinFET) is an emerging multi-gate device. Compared with a planar Metal-Oxide Semiconductor Field Effect Transistor (MOSFET), a fin field effect transistor has stronger short-channel suppression ability and stronger working current, and has been widely used in various semiconductor devices. However, with the further development of semiconductor technology, the scale of transistors has been reduced to below a few nanometers. After the size of a FinFET itself has been reduced to the limit, limit of fin distance, short channel effect, leakage, or material, has made transistor manufacturing precarious, and even the physical structure cannot be completed.

Gate-all-around (GAA) devices have become a new direction of research and development in the industry. The feature of this technology includes that a gate is wrapped around a channel on all sides. Also, sources and drains are no longer in contact with a substrate, but a plurality of sources and drains with a linear shape (can be understood as a stick shape), a flat shape, or a sheet shape are distributed vertically and perpendicular to the gate, to achieve the basic structure and function of a MOSFET. This design largely solves various problems caused by the reduction of gate pitch size, including capacitive effects, etc. Further, the channel is surrounded by the gate on all sides, such that the channel current is also smoother than that of FinFETs wrapped on three sides.

However, the performance of existing gate-all-around gate devices needs to be further improved.

SUMMARY

One aspect of the present disclosure provides a semiconductor structure. The semiconductor structure includes: a substrate, a plurality of composite layers on the substrate, a gate structure crossing the plurality of composite layers; inner spacers, source/drain layers, and insulating layers. The plurality of composite layers extends along a first direction. Each of the plurality of composite layers includes a plurality of channel layers stacked along a direction perpendicular to a surface of the substrate. Each of the plurality of composite layers further includes first openings between the plurality of channel layers and the substrate, and second openings between adjacent channel layers. The second openings make the adjacent channel layers suspended from each other. In the direction perpendicular to the surface of the substrate, the first openings have a first size, and the second openings

2 have a second size. The first size is smaller than the second size. The gate structure includes a gate. The gate structure is located on a portion of surfaces of side walls and top surfaces of the plurality of composite layers, and is also located in the second openings and surrounds the plurality of channel layers. The inner spacers are located between adjacent channel layers, and between the plurality of channel layers and the substrates. The inner spacers are also located on sidewalls of the gate. The source/drain layers are located in the plurality of composite layers on two sides of the gate structure. Sidewalls of the source/drain layers are coplanar with the sidewalls of adjacent inner spacers and end faces of adjacent channel layers. The insulating layers are located in the first openings.

Optionally, the semiconductor structure further includes an interlayer dielectric layer located on the substrate, on the surfaces of the plurality of composite layers, and on the sidewalls of the gate structure.

Optionally, the gate structure further includes a gate oxide layer and a gate dielectric layer on a surface of the gate oxide layer, wherein the gate is located on a surface of the gate dielectric layer.

Optionally, the gate oxide layer on the surface of the insulating layers and the gate dielectric layer on the surface of the gate oxide layer are also located in the first openings.

Another aspect of the present disclosure provides a fabrication method for forming a semiconductor structure. The method includes: providing a substrate; forming a plurality of initial composite layers and a dummy gate structure crossing the plurality of initial composite layers. The plurality of initial composite layers extends along a first direction. The dummy gate structure is located on surfaces of sidewalls and top surfaces of the plurality of initial composite layers. The dummy gate structure includes a dummy gate layer. Each of the plurality of initial composite layers includes a first sacrificial layer, a plurality of channel layers vertically stacked on the first sacrificial layer, and second sacrificial layers located between adjacent channel layers. Along a direction perpendicular to the substrate, the first sacrificial layer has a first size, the second sacrificial layers have a second size, wherein the first size is smaller than the second size. The method further includes: replacing first sacrificial layers with insulating layers.

Optionally, after forming the dummy gate structure and before replacing the first sacrificial layers with the insulating layers, the method further includes: forming an interlayer dielectric layer on the substrate, and on surfaces of the plurality of initial composite layers and the dummy gate structure, where the interlayer dielectric layer exposes the dummy gate layer; and removing the dummy gate layer to form a gate opening in the interlayer dielectric layer.

Optionally, replacing the first sacrificial layers with the insulating layers includes: removing the first sacrificial layers and the second sacrificial layers exposed by the gate opening, to form first openings between the plurality of channel layers and the substrate, and second openings between adjacent channel layers; and forming the insulating layers in the first openings. The plurality of composite layers is formed from the plurality of initial composite layers. Each of the plurality of composite layers includes the plurality of channel layers vertically stacked, the first openings between the plurality of channel layers and the substrate, and the second openings between adjacent channel layers.

Optionally, forming the insulating layers in the first openings includes: forming an insulating dielectric material layer on the surfaces of the plurality of channel layers exposed by the gate opening, the first openings, and the second openings, such that the insulating dielectric material layer fills up the first openings and the insulating layers are formed from a portion of the insulating dielectric material in the first openings.

Optionally, a thickness of the first sacrificial layers is about 3 nm to about 15 nm.

Optionally, the method further includes: after forming the insulating layers, removing another portion of the insulating dielectric material layer in the gate opening and in the second openings, to expose the surfaces of the plurality of channel layers; forming a gate oxide layer on the exposed surfaces of the plurality of channel layers and a gate dielectric layer located on a surface of the gate oxide layer; and after the gate dielectric layer is formed, forming a gate in the gate opening and the second openings, wherein a gate structure includes the gate.

Optionally, forming the insulating layers in the first openings includes: forming a gate oxide layer and a gate dielectric layer on the surfaces of the plurality of channel layers exposed by the gate opening, in the first openings, and in the second openings, such that the gate oxide layer and the gate dielectric layer fill up the first openings and the insulating layers are formed from a portion of the gate oxide layer and the gate dielectric layer in the first openings.

Optionally, after forming the insulating layers, the method further includes forming a gate in the gate opening and the second openings, where a gate structure includes the gate.

Optionally, a thickness of the first sacrificial layers is about 3 nm to about 8 nm.

Optionally, replacing the first sacrificial layers with the insulating layers includes: removing the first sacrificial layers exposed by the gate opening, to form first openings between the plurality of channel layers and the substrate; and forming an insulating material layer in the first openings and the gate opening, where a portion of the insulating material layer in the first openings forms the insulating layers.

Optionally, the method further includes: removing another portion of the insulating material layer in the gate opening to expose the surfaces of the plurality of channel layers exposed by the gate opening; removing the second sacrificial layers exposed by the gate opening, to form second openings between adjacent channel layers, and forming a gate in the gate opening and the second openings. The plurality of composite layers is formed from the plurality of initial composite layers. Each of the plurality of composite layers includes the plurality of channel layers vertically stacked, the first openings between the plurality of channel layers and the substrate, and the second openings between adjacent channel layers. A gate structure includes the gate.

Optionally, the first sacrificial layers and the second sacrificial layers are made of a material including silicon germanium. Germanium concentration in the first sacrificial layers is larger than germanium concentration in the second sacrificial layers. The germanium concentration in the first sacrificial layers is about 25% to about 40%, and the germanium concentration in the second sacrificial layers is about 10% to about 25%.

Optionally, when removing the first sacrificial layers exposed by the gate opening, the ratio of etching selectivity of the first sacrificial layer and etching selectivity of the second sacrificial layers is about 3:1 to about 100:1.

Optionally, the method further includes: forming source/drain layers in the plurality of initial composite layers at two sides of the dummy gate structure.

Optionally, forming the source/drain layers, the plurality of initial composite layers, and the dummy gate structure includes: forming an initial composite material layer on the surface of the substrate, wherein the initial composite material layer includes a first sacrificial material layer, a plurality of channel material layers vertically stacked on the first sacrificial material layer, and second sacrificial material layers between adjacent channel material layers; etching the initial composite material layer until the surface of the substrate is exposed, to form the plurality of composite material layers, wherein the plurality of composite material layers extend along the first direction; forming a dummy gate structure across the plurality of composite material layers, wherein the dummy gate structure is located on a portion of sidewalls and surfaces of the plurality of composite material layers; using the dummy gate structure as a mask, etching the plurality of composite material layers until the substrate is exposed; forming third openings in the plurality of composite material layers, to form the plurality of initial composite layers; using the plurality of channel material layer as the plurality of channel layers, and using the first sacrificial material layer as the first sacrificial layers, and the second sacrificial material layer as the second sacrificial layers; and forming the source/drain layers in the third openings.

Optionally, inner spacers are provided between adjacent channel layers, and between the plurality of channel layers and the substrates; and the inner spacers are also located on sidewalls of the gate.

Optionally, the inner spacers are formed by: after forming the third openings and before forming source/drain layers, etching the first sacrificial layers and the second sacrificial layers, to form fourth openings between adjacent channel layers, and between the plurality of channel layers and the substrates; and forming inner spacers in the fourth openings.

In the fabrication method of the semiconductor structure provided by various embodiments of the present disclosure, the first sacrificial layers may be replaced by the insulating layers, and the insulating layers may be disposed between the gates and the substrates. The parasitic capacitance between the gates and the substrate may be suppressed, to reduce the turn-on condition and the leakage probability of the bottom parasitic transistor, thereby improving the performance of the device.

In the semiconductor structure provided by various embodiments of the present disclosure, the first sacrificial layers may be replaced by the insulating layers, and the insulating layers may be disposed between the gates and the substrates. The parasitic capacitance between the gates and the substrate may be suppressed, to reduce the turn-on condition and the leakage probability of the bottom parasitic transistor, thereby improving the performance of the device.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be noted that "surface" or "upper" in this specification are used to describe the relative positional relationship in space, and are not limited to whether they are in direct contact.

Figure 1:
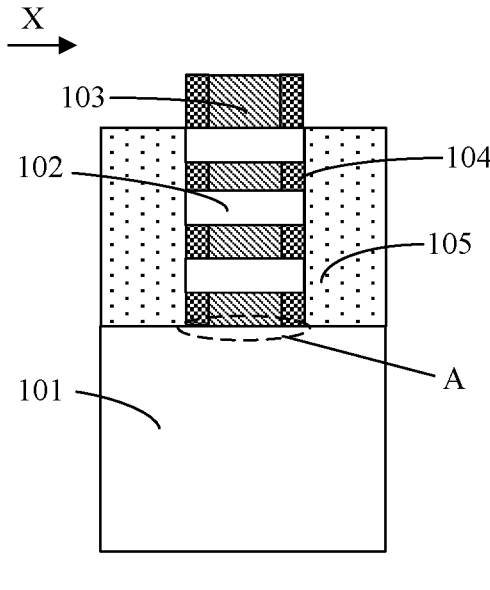
FIG. 1 illustrates a cross-sectional view of a semiconductor structure.

FIG. 1 illustrates a cross-sectional view of a semiconductor structure. As shown in FIG. 1, the semiconductor structure includes: a substrate 101; a composite layer located on a portion of a surface of the substrate 101 and extending along a first direction X; first openings (not shown in the figure) in the composite layer exposing a surface of the substrate 101; a plurality of channel layers 102 vertically stacked in the composite layer; second openings (not shown in the figure) between adjacent channel layers 102, where each second opening makes adjacent channel layers 102 suspended; gate structures 103 located on the surface of the composite layer and surrounding the plurality of channel layers 102; inner walls 104 between adjacent channel layers 102 and on the sidewalls of the first openings, where the outer sidewalls of the inner walls 104 are co-vertical to the sidewalls of the plurality of channel layers 102; and source/drain layers 105 located in the first openings.

The above gate-all-around gate device includes a bottom parasitic transistor phenomenon between the bottom of the gate structures 103 and the substrate 101 (shown as A in FIG. 1). In one embodiment, the substrate 101 is implanted with a high-dose dopant to reduce the turn-on of the bottom parasitic transistor, but the capacitance problem between the bottom parasitic transistor and the substrate has not been solved, and the risk of electric leakage still exists.

The present disclosure provides a semiconductor structure and its fabrication method, to at least partially alleviate the above problem. In the semiconductor structure and its fabrication method provided by the present disclosure, an insulating layer may be used to replace the first sacrificial layer, and may be disposed between the gate and the substrate, to reduce the parasitic capacitance between the gate the substrate. Therefore, the turn-on of the bottom parasitic transistor may be reduced, and the possibility of electric leakage of the bottom parasitic transistor may be also reduced, to improve the performance of the device.

The present disclosure provides a semiconductor structure and its fabrication method. FIGS. 2-23 illustrate semiconductor structures corresponding to certain stages of forming a semiconductor structure.

Figure 2:
FIGS. 2-23 illustrate cross-sectional views of semiconductor structures corresponding to certain stages of forming an exemplary semiconductor structure according to various disclosed embodiments of the present disclosure.

As shown in FIG. 2, a substrate 200 may be provided.

In one embodiment, the substrate 200 may be made of a material including silicon. In another embodiment, the substrate 200 may be made of a semiconductor material including polysilicon, germanium, silicon germanium, gallium Arsenide, silicon-on-insulator, or germanium-on-insulator.

In one embodiment, the substrate 200 may include a well region (not shown in the figure), and the well region may include first dopant ions. Specifically, in this embodiment, the first dopant ions may be N-type ions, which are used to form a well region of a PMOS device. In other embodiments, the first dopant ions may be P-type ions, which are used to form a well region of an NMOS device.

Subsequently, a plurality of initial composite layers and dummy gate structures crossing the initial composite layers may be formed on the substrate 200. The plurality of initial composite layers may extend along a first direction, and the dummy gate structures may be located on sidewalls and top surfaces of the initial composite layers. Each dummy gate structure may include a dummy gate layer. Each of the plurality of initial composite layers may include a first sacrificial layer, a plurality of channel layers vertically stacked on the first sacrificial layer, and a second sacrificial layer located between two adjacent channel layers. Along a direction perpendicular to the surface of the substrate, the first sacrificial layer may have a first size, and the second sacrificial layer may have a second size. The first size may be smaller than the second size.

In one embodiment, the semiconductor structure may further include source/drain layers in the initial composite layers on both sides of each dummy gate structure.

In one embodiment, the source/drain layers, the initial composite layers, and the dummy gate structures, may be formed, as shown in FIG. 3 to FIG. 11.

Figure 3:
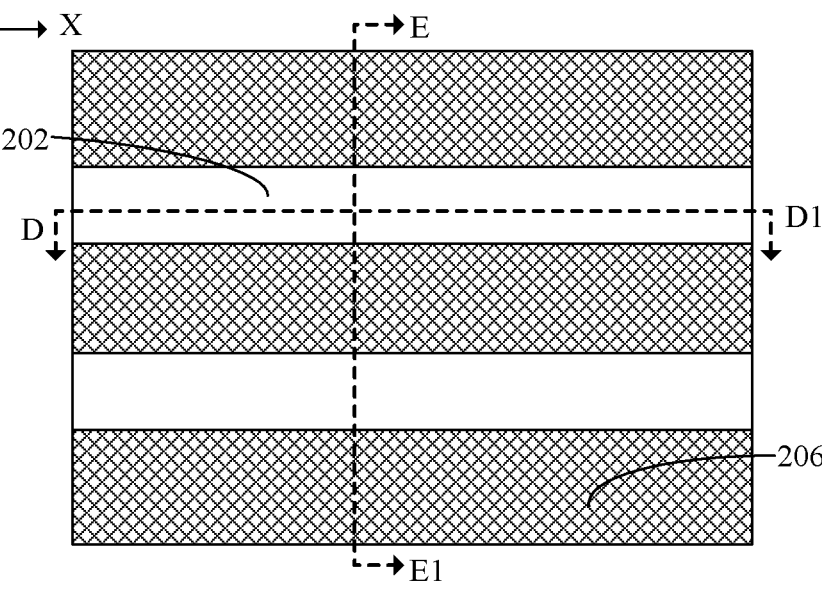
Figure 4:
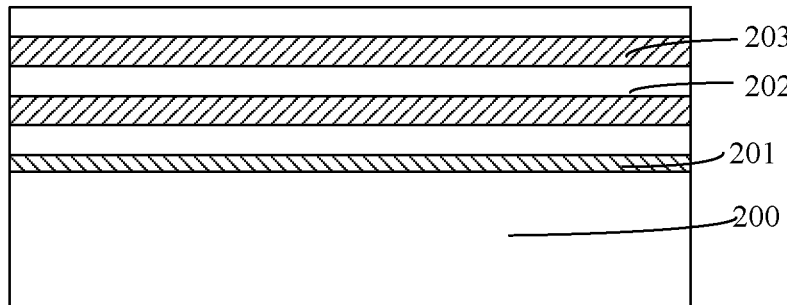
Figure 5:
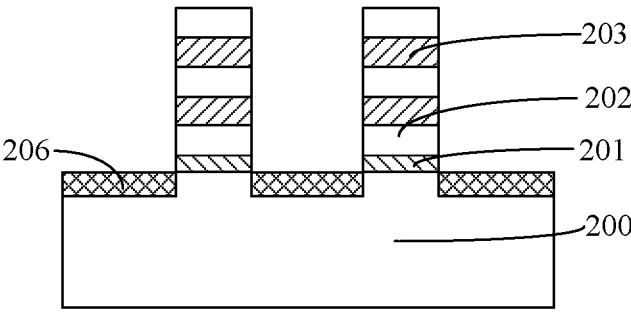

As shown in FIG. 3 which is a top view of the semiconductor structure, FIG. 4 which is a cross-sectional view along a DD1 direction in FIG. 3, and FIG. 5 which is a cross-sectional view along an EE1 direction in FIG. 3, an initial composite material layer may be formed on the surface of the substrate 200. The initial composite material layer may include a first sacrificial material layer 201, a plurality of channel material layers vertically stacked on the first sacrificial material layer 201, and a second sacrificial material layer 203 between two adjacent channel material layers 202. The initial composite material layer may be etched until the surface of the substrate 200 is exposed, to form a plurality of composite material layers. The plurality of composite material layers may extend along a first direction X.

In one embodiment, after etching the initial composite material layer, the substrate 200 may be etched, to form a groove in the substrate 200. Then an isolation layer 206 may be formed in the groove.

The first sacrificial material layer 201 may be used to form first sacrificial layers; the second sacrificial material layer 203 may be used to form second sacrificial layers; and the channel material layer may be used to form the plurality of channel layers. The first sacrificial layer may occupy a space for the subsequent formation of insulating layers, and the second sacrificial layer may occupy a space for the subsequent formation of gates.

The first sacrificial material layer 201, the second sacrificial material layer 203 and the plurality of channel material layers 202 may be made of different materials, such that an etching process where the first sacrificial layer and the second sacrificial layer have a higher etching selectivity than the plurality of channel material layers, may be selected when the first sacrificial layer and the second sacrificial layer are subsequently removed. The impact on the plurality of channel layers may be alleviated. In one embodiment, the first sacrificial material layer and the second sacrificial material layer may be made of a same material, to facilitate subsequent simultaneous removal of the first sacrificial layer and the second sacrificial layer. In another embodiment, the first sacrificial material layer and the second sacrificial material layer may be made of different materials, and an etching process where the first sacrificial material layer has a larger etching selectivity ratio than the second sacrificial layer may be selected to remove the first sacrificial layer first and then remove the second sacrificial layer.

The materials of the first sacrificial material layer 201 and the second sacrificial material layer 203 may have goo lattice matching with the material of the plurality of channel material layers 202, to obtain smooth interfaces between the first sacrificial layer and plurality of channel layers, smooth interfaces between the second sacrificial layer and the plurality of channel layers. Therefore, the surfaces of the subsequently formed the plurality of channel layers may be smooth, which may be beneficial to obtain the device with good performance.

In this embodiment, the plurality of channel material layers 202 may be made of a material including silicon; and the first sacrificial material layer 201 and the second sacrificial material layer 203 may be made of a material including silicon germanium. In other embodiments, the plurality of channel material layers 202 may be made of a material including Ge or GeSi; and the first sacrificial material layer 201 and the second sacrificial material layer 203 may be made of a material including ZnS, ZnSe, BeS or GaP.

Figure 6:
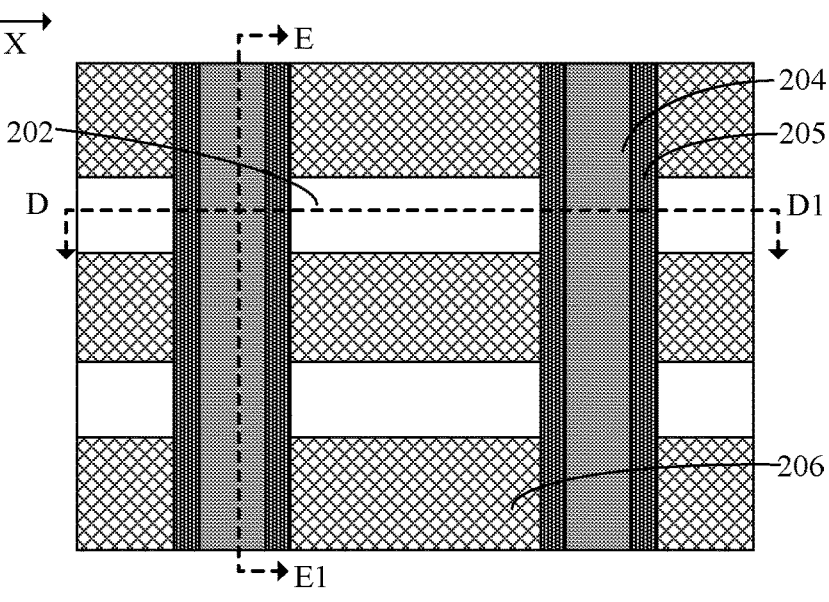
Figure 7:
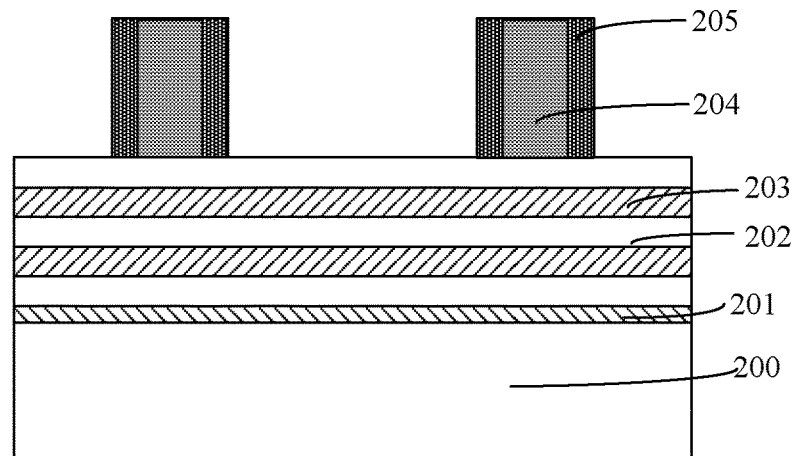
Figure 8:
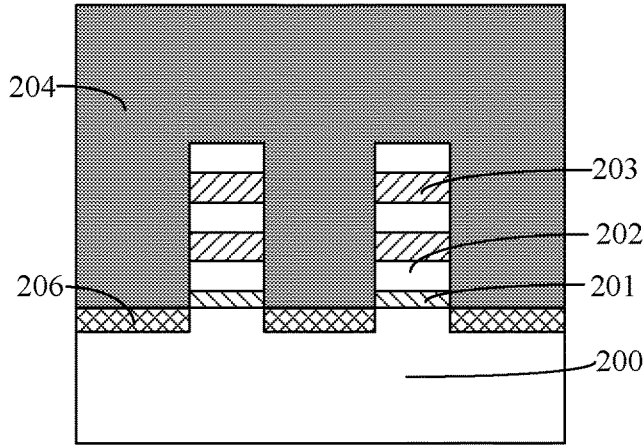

As shown in FIG. 6 which is a top view of the semiconductor structure, FIG. 7 which is a cross-sectional view along a DD1 direction in FIG. 6, and FIG. 8 which is a cross-sectional view along an EE1 direction in FIG. 6, dummy gate structures may be formed crossing the plurality of composite material layers. The gate structures may be disposed on a portion of sidewalls and top surfaces of the plurality of composite material layers.

In one embodiment, each dummy gate structure may include a dummy gate layer 204 and a gate spacer 205 on sides of the sidewalls of the gate layer 204. The dummy gate layer 204 may be used to occupy a space for subsequently forming a gate.

Figure 9:
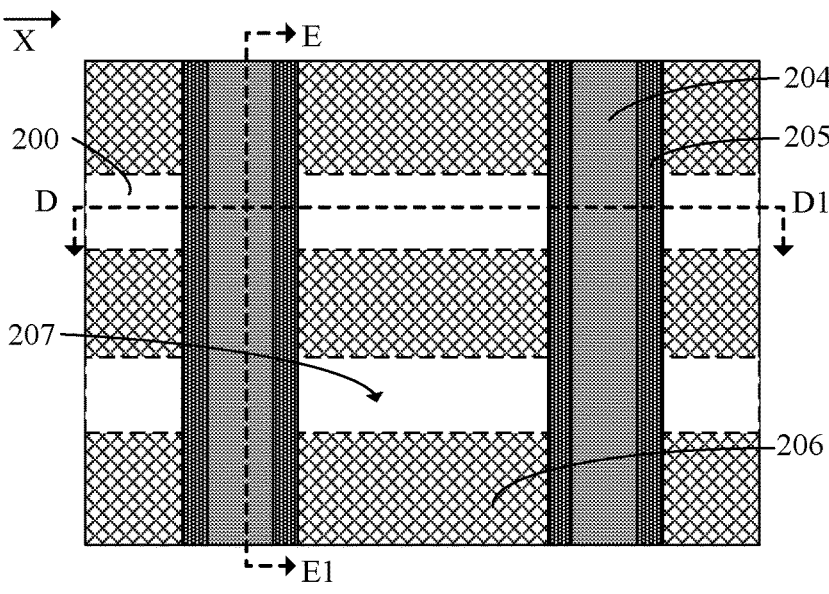
Figure 10:
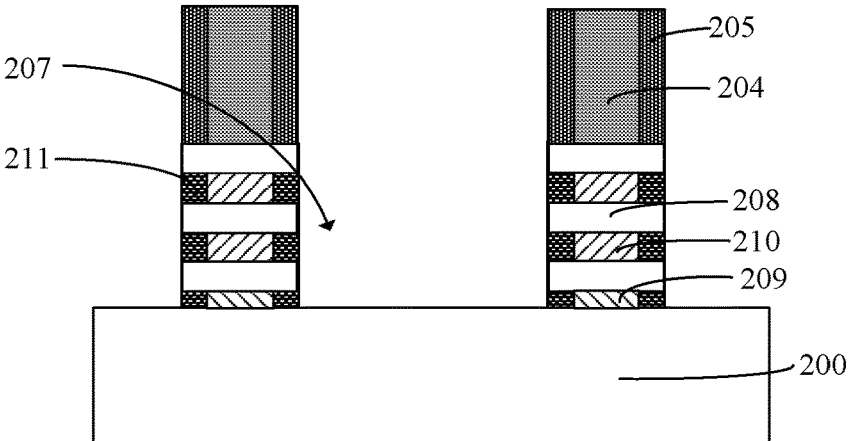
Figure 11:
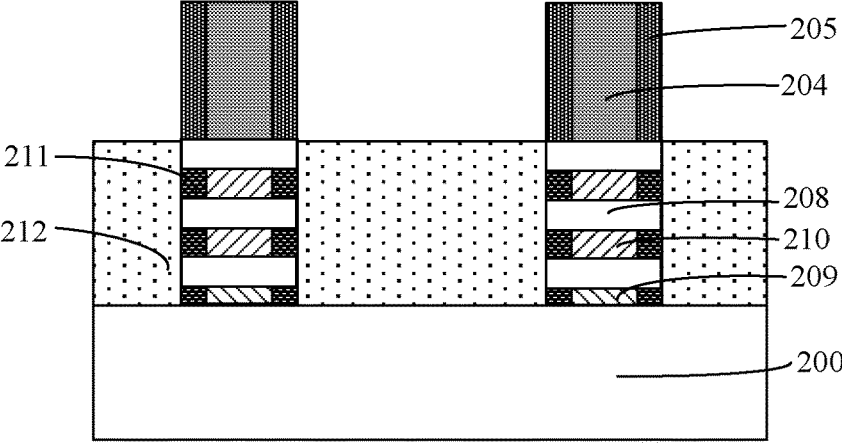

In one embodiment, source/drain layers in the initial composite material layer at two sides of each dummy gate structure may be formed, as shown in FIG. 9 to FIG. 11.

As shown in FIG. 9 which is a top view of the semiconductor structure and FIG. 10 which is a cross-sectional view along a DD1 direction in FIG. 9, the plurality of composite material layers may be etched by using the dummy gate structures as a mask until the substrate 200 is exposed, to form third openings 207 in the plurality of composite material layers and a plurality of initial composite layers. The plurality of channel material layer 202 may be used as the plurality of channel layers 208, the first sacrificial material layer 201 may be used as first sacrificial layers 209, and the second sacrificial material layer 203 may be used as second sacrificial layers 210.

Each initial composite layer may include one of the first sacrificial layers 209, the plurality of channel layers 208 vertically stacked on the first sacrificial layer 209, and one of the second sacrificial layers 210 located between two adjacent channel layers 208. In a direction perpendicular to the surface of the substrate 200, the first sacrificial layer 209 may have a first size, and the second sacrificial layer 210 may have a second size. The first size may be smaller than the second size.

In one embodiment, the first sacrificial layer 209 may have a thickness from about 3 nm to about 15 nm.

In one embodiment, the semiconductor structure may further include inner spacers 211 between adjacent channel layers 208, and between the plurality of channel layers 208 and the substrate 200. The inner spacers 211 may be further disposed on sidewalls of the second sacrificial layers 210 and the first sacrificial layers 209.

In one embodiment, the inner spacers 211 may be formed by: before forming the third openings 207 and before forming the source/drain layers, etching the first sacrificial layers 209 and the second sacrificial layers 210, to form fourth openings (not shown in the figure) between the two adjacent channel layers 208 and between the channel layer 208 and the substrate 200; and forming the inner spacers 211 in the fourth openings.

The inner spacers 211 may be used to separate the gates and the source/drain layers.

As shown in FIG. 11 which has a view angle same as FIG. 10, the source/drain layers 212 may be formed in the third openings 207.

Specifically, the source/drain layers 212 may include: forming epitaxial layers in the third openings 207; and implanting second doping ions into the epitaxial layers, to form the source/drain layers.

In one embodiment, the second doping ions may be P-type ions. In other embodiments, the second doping ions may be N-type ions.

Subsequently, the first sacrificial layers 209 may be replaced by insulating layers.

Figure 12:
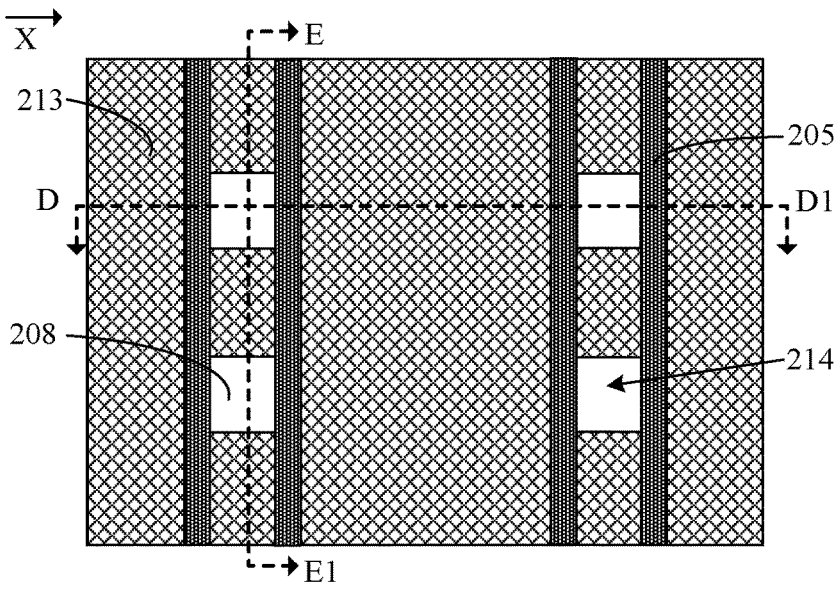
Figure 13:
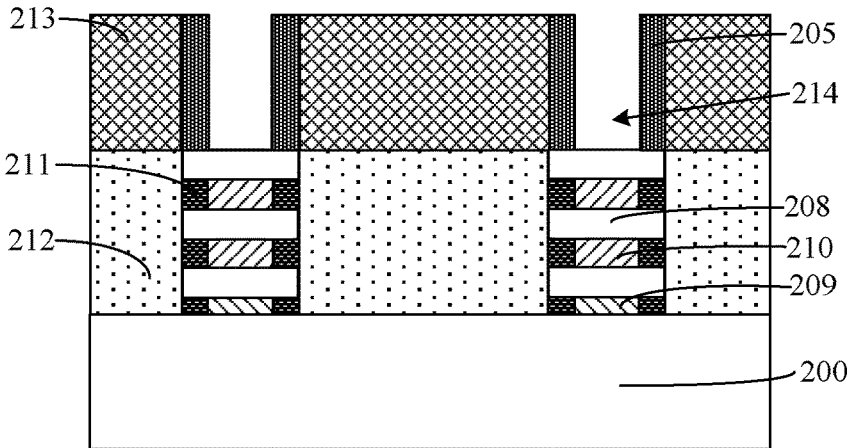
Figure 14:
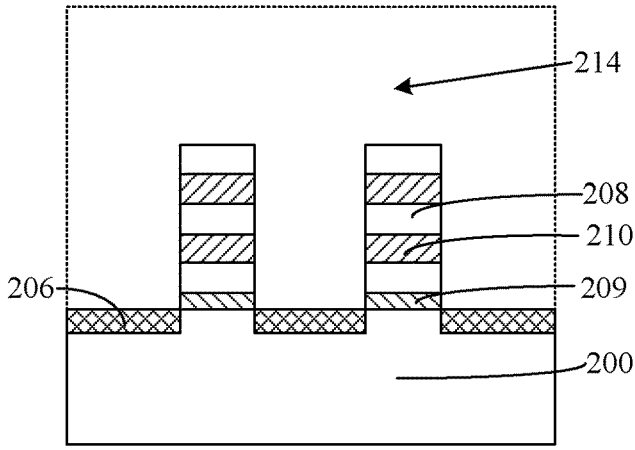

As shown in FIG. 12 which is a top view of the semiconductor structure, FIG. 13 which is a cross-sectional view along a DD1 direction in FIG. 12, and FIG. 14 which is a cross-sectional view along an EE1 direction in FIG. 12, after forming the dummy gate structures and before replacing the first sacrificial layers with the insulating layers, an interlay dielectric layer 213 may be formed on the surfaces of the substrate 200, the initial composite layers, and the dummy gate structures. The interlayer dielectric layer 213 may expose the dummy gate layers 204. Then the dummy gate layers 204 may be removed to form gate openings 214 in the interlayer dielectric layer 213.

The interlayer dielectric layer 213 may be formed by: forming an interlayer dielectric material layer on the surfaces of the substrate 200, the initial composite layers, and the dummy gate structures; and planarizing the interlayer dielectric material layer until exposing the surfaces of the dummy gate layers 204.

The dummy gate layers 204 may be removed by a dry etching method, a wet etching method, or a combination thereof.

In one embodiment, the first sacrificial layers 209 may be replaced by the insulating layers, as shown in FIG. 15 to FIG. 20.

Figure 15:
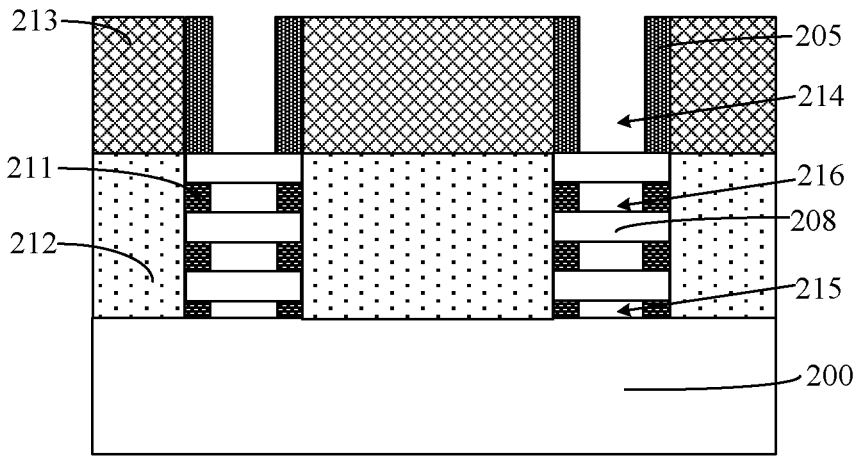
Figure 16:
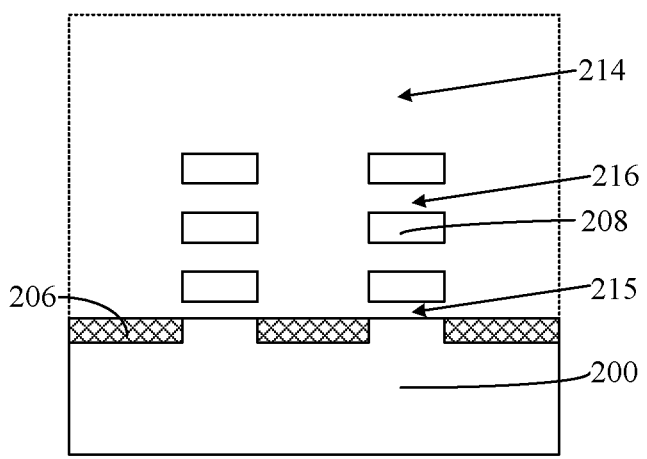

As shown in FIG. 15 whose view angle is same as FIG. 13 and FIG. 16 whose view angle is same as FIG. 14, the first sacrificial layers 209 and the second sacrificial layers 210 exposed by the gate openings 214 may be removed to form the first opening 215 between the channel layers 208 and the substrate 200, and the second openings 216 between adjacent channel layers 208, such that the composite layers are formed from the initial composite layers. Each composite layer may include the plurality of channel layers 208 vertically stacked, located between the channel layer 208 and the substrate 200, the first opening 215 between the channel layers 208 and the substrate 200, and the second openings 216 between adjacent channel layers 208.

The first sacrificial layers 209 and the second sacrificial layers 210 exposed by the gate openings 214 may be removed by a dry etching process, a wet etching process, or a combination thereof. In this embodiment, the first sacrificial layers 209 and the second sacrificial layers 210 exposed by the gate openings 214 may be removed by the wet etching process.

Subsequently, the insulating layers may be formed in the first openings 215, as shown in FIG. 17 to FIG. 20.

Figure 17:
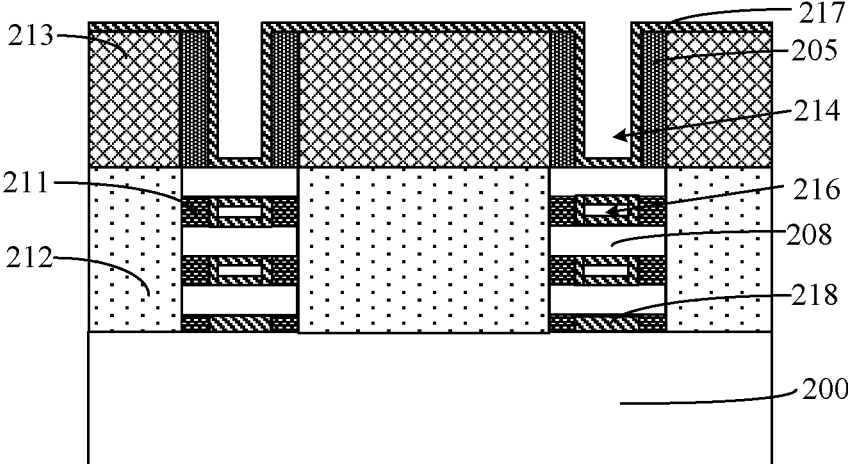
Figure 18:
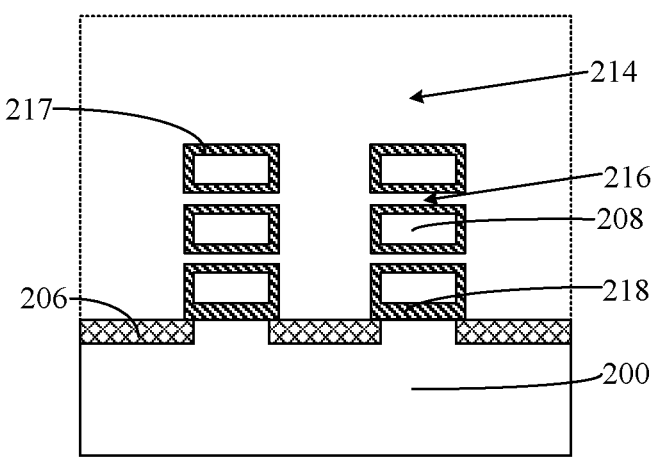

As shown in FIG. 17 whose view angle is same as FIG. 15 and FIG. 18 whose view angle is same as FIG. 16, an insulating dielectric material layer 217 may be formed on the surfaces of the plurality of channel layers 208 exposed by the gate openings 214, the first openings 215, and the second openings 216, such that the insulating dielectric material layer 217 fills the first openings 215. A portion of the insulating dielectric material layer 217 in the first openings 215 may form the insulating layers 218.

In this embodiment, the insulating dielectric material layer 217 may be made of a material including silicon oxide. In other embodiments, the insulating dielectric material layer may be made of a dielectric material, a high-K dielectric material (referring to a dielectric material with a relative permittivity higher than 3.9, such as hafnium oxide), or a combination of the dielectric material and a high-K dielectric material. The dielectric material may include silicon oxide, silicon nitride, silicon carbide, silicon oxycarbide, silicon oxynitride, aluminum oxide, aluminum nitride, silicon carbide nitride, silicon oxycarbide, or a combination thereof.

Figure 19:
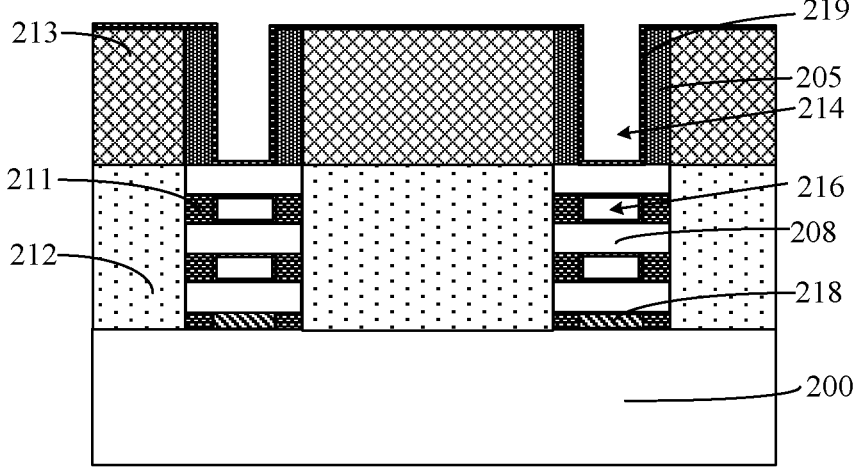
Figure 20:
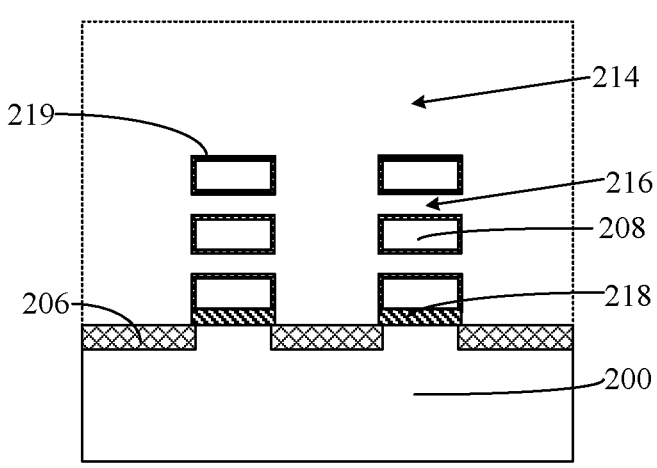

As shown in FIG. 19 and FIG. 20, after the insulating layers 218 are formed, a portion of the insulating material layers 217 in the gate openings 214 and the second openings 216 may be removed, such that the surfaces of the plurality of channel layers 208 are exposed. Then, the gate oxide layers (not shown in the figure) and the gate dielectric layers 219 located on the surfaces of the gate oxide layers may be formed on the exposed surfaces of the plurality of channel layers 208.

Since the first sacrificial layers 209 have the first size and the second sacrificial layers 210 have the second size, the first size may be smaller than the second size, that is, a portion of the insulating material layer 217 in the first openings 215 may be more difficult to remove than another portion of the insulating material layer 217 in the gate openings 214 and the second openings 216. Therefore, the insulating layers 218 may be preserved.

In this embodiment, after the etching process of removing the insulating material layer 217 in the gate openings 214 and the second openings 216, the insulating layers 218 may be preserved completely. In other embodiments, the gate oxide layers located on the surfaces of the insulating layers and the gate dielectric layer located on the surfaces of the gate oxide layers may be located in the first openings. That is, after the etching process of removing the insulating material layer 217 in the gate openings 214 and the second openings 216, the insulating layers may be preserved partially. In the subsequent forming process of the gate oxide layers and the gate dielectric layers, the materials of the gate oxide layers and the gate dielectric layers may fill the first openings, and play the same role as the insulating layers. The shape of the insulating layers may be related to the etching process of removing the insulating material layer 217 in the gate openings 214 and the second openings 216.

The first sacrificial layers 209 may be replaced by the insulating layers 218, and the insulating layers 218 may be disposed between the gates and the substrates 200. The parasitic capacitance between the gates and the substrate 200 may be suppressed, to reduce the turn-on condition and the leakage probability of the bottom parasitic transistor, thereby improving the performance of the device.

Figure 21:
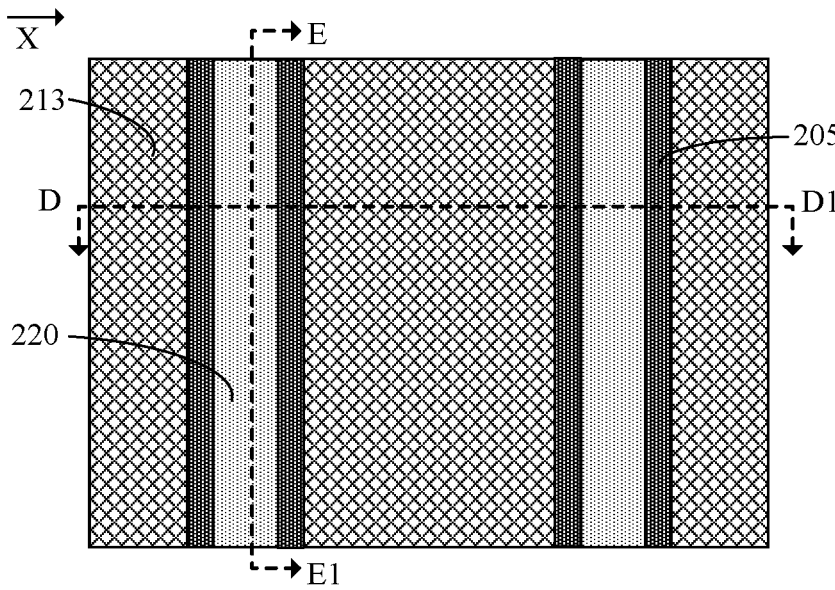
Figure 22:
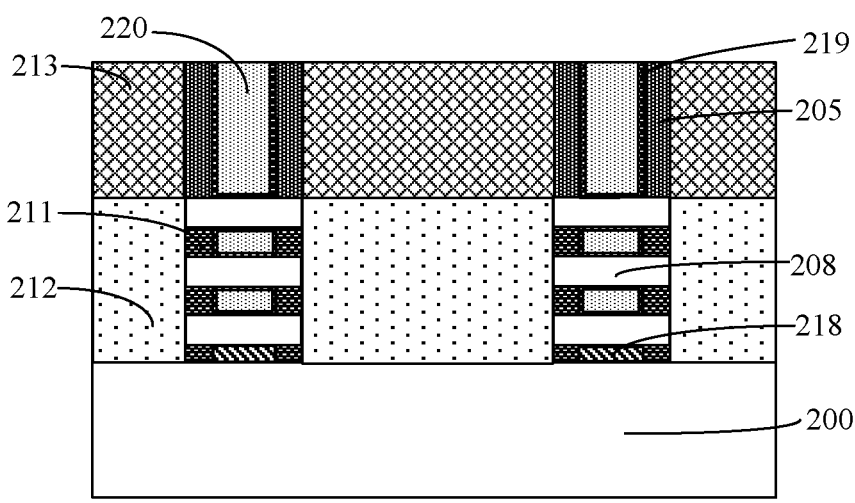
Figure 23:
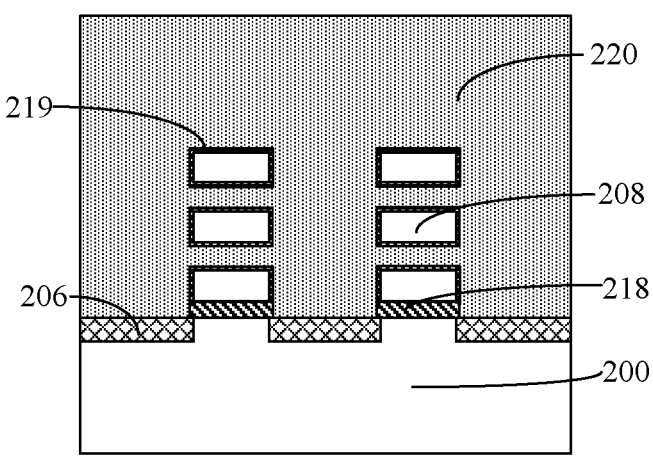

As shown in FIG. 21 which is a top view of the semiconductor structure, FIG. 22 which is a cross-sectional view along a DD1 direction in FIG. 21, and FIG. 23 which is a cross-sectional view along an EE1 direction in FIG. 21, after forming the gate dielectric layers 219, the gates 220 may be formed in the gate openings 214 and the second openings 216. The gate structures may include the gates 220.

The gates 220 may be formed by: forming a gate material layer on the surface of the interlayer dielectric layer 213, in the gate openings 214 and the second openings 216; and planarizing the gate material layer until exposing the surface of the interlayer dielectric layer 213.

The gates 220 may be made of a material including a metal. The metal may include tungsten, copper, gold, or a combination thereof. In the present embodiment, the gates 220 may be made of tungsten.

The present disclosure also provides a semiconductor structure. As shown in FIG. 21 to FIG. 23, in one embodiment, the semiconductor structure may include: a substrate 200; a plurality of composite layers; and gate structures crossing the plurality of composite layers. Each composite layer may extend along a first direction X. Each of the composite layers may include a plurality of channel layers 208 stacked along a direction perpendicular to the surface of the substrate. There may be first openings 215 (as shown in FIG. 16) between the plurality of channel layers 208 and the substrate 200, and second openings 216 (as shown in FIG. 16) between adjacent channel layers 208. In the direction perpendicular to the surface of the substrate 200, the first openings 215 may have a first size, and the second openings may have a second size. The first size may be smaller than the second size. The gate structures may include gates 220, and may be located on a portion of the sidewall surfaces and the top surfaces of the plurality of composite layers. The gate structure may be also located in the second openings 216 and surround the plurality of channel layers 208. The insulating layers 218 may be located in the first openings 215.

In one embodiment, the semiconductor structure may further include: an interlayer dielectric layer 213 located on the substrate 200, on the surfaces of the plurality of composite layers, and on the sidewalls of the gate structures; and source/drain layers 212 in the plurality of composite layers at two sides of each gate structure.

In one embodiment, the semiconductor structure may further include: inner spacers 211 located between adjacent channel layers 208, between the plurality of channel layers 208 and the substrate 200. The inner spacers 211 may be also located on the sidewalls of the gates 220.

In one embodiment, each of the gate structures may include a gate oxide layer (not shown in the figure), and a gate dielectric layer 219 located on the surface of the gate oxide layer. The gates 220 may be located on the surfaces of the gate dielectric layers 219.

Another embodiment of the present disclosure shown in FIG. 24 to FIG. 28 provides another fabrication method of a semiconductor structure.

In this embodiment, the method for replacing the first sacrificial layers with the insulating layers is different from the previous embodiments. Specifically, the method for forming the insulating layers in the first openings may be different. In the present embodiment, a total thickness of the gate dielectric layer and the gate oxide layer in each gate structure formed subsequently may be larger than the size of the first sacrificial layers. That is, the gate dielectric layer and the gate oxide layer may fill up one corresponding first opening. In one embodiment, the first sacrificial layers may have a thickness of about 3 nm to about 8 nm.

Figure 24:
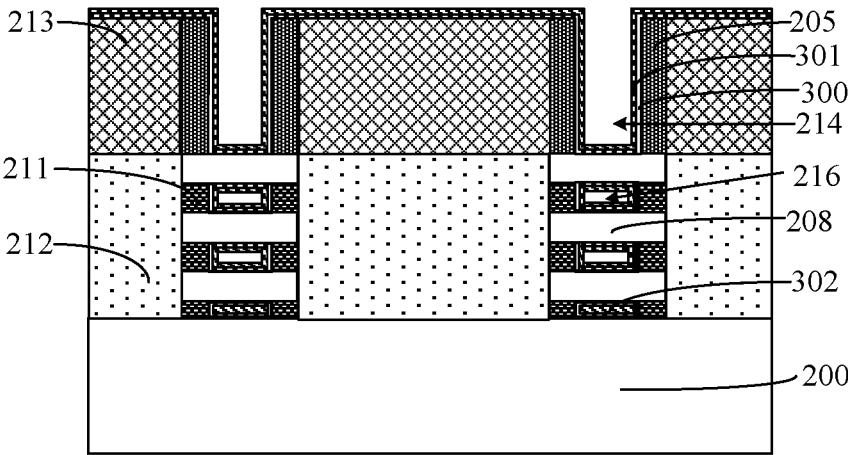
FIGS. 24-28 illustrate cross-sectional views of semiconductor structures corresponding to certain stages of forming another exemplary semiconductor structure according to various disclosed embodiments of the present disclosure.
Figure 25:
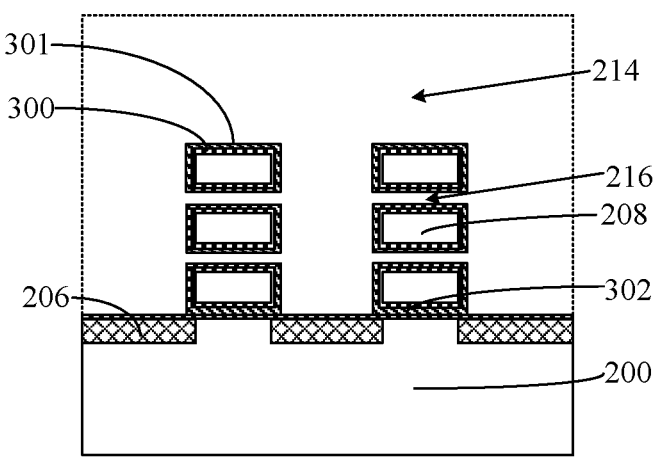

In this embodiment, the insulating layers may be formed in the first openings, as shown in FIG. 24 and FIG. 25 based on FIG. 15 and FIG. 16.

Figure 26:
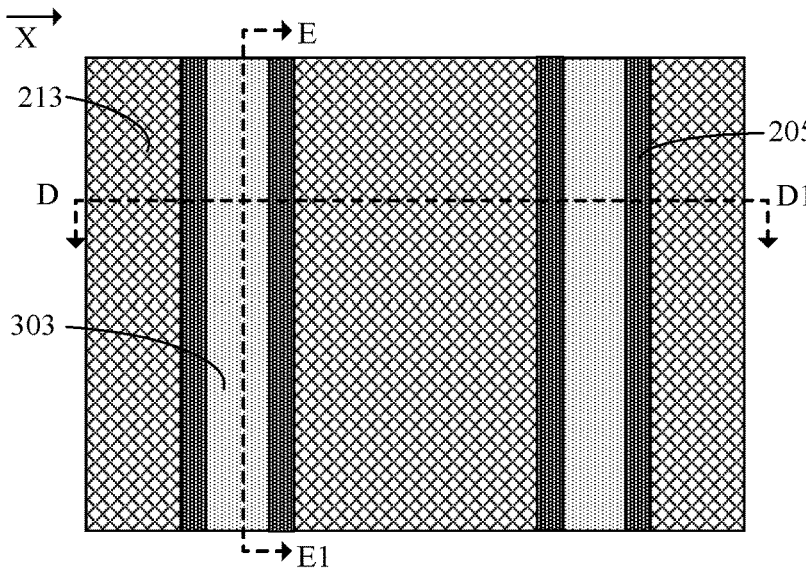

As shown in FIG. 24 whose view angle is same as FIG. 15 and FIG. 26 whose view angle is same as FIG. 16, the gate oxide layers 300 and the gate dielectric layers 301 located on the surfaces of the gate oxide layers 300 may be formed on the surfaces of the plurality of channel layers 208 exposed by the gate openings 214, the first openings 215, and the second openings 216. The gate oxide layers 300 and the gate dielectric layers 301 may fill up the first openings 215, such that the gate oxide layers 300 and the gate dielectric layers 301 in the first openings 215 may form the insulating layers.

In this embodiment, the gate oxide layers 300 and the gate dielectric layers may be not only used to form the gate oxide layers and the gate dielectric layers of the gate structures, but also used to fill the first openings 215 to form the insulating layers 302.

The insulating layers 302 may be disposed between the gates and the substrates 200. The parasitic capacitance between the gates and the substrate 200 may be suppressed, to reduce the turn-on condition and the leakage probability of the bottom parasitic transistor, thereby improving the performance of the device.

Figure 27:
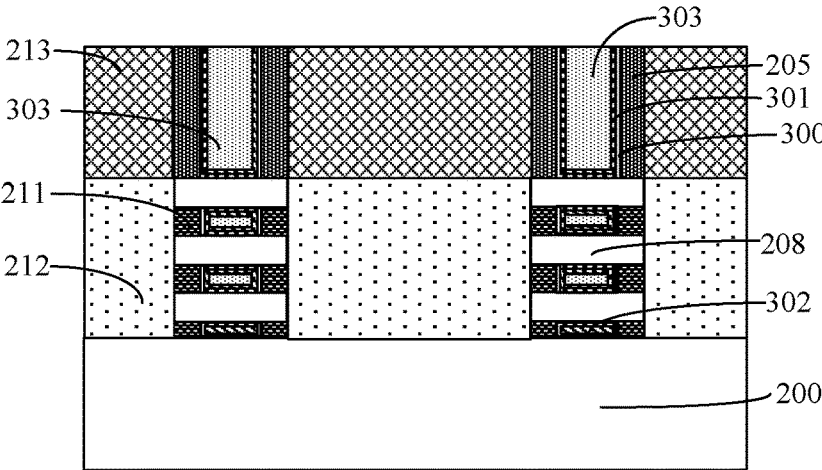
Figure 28:
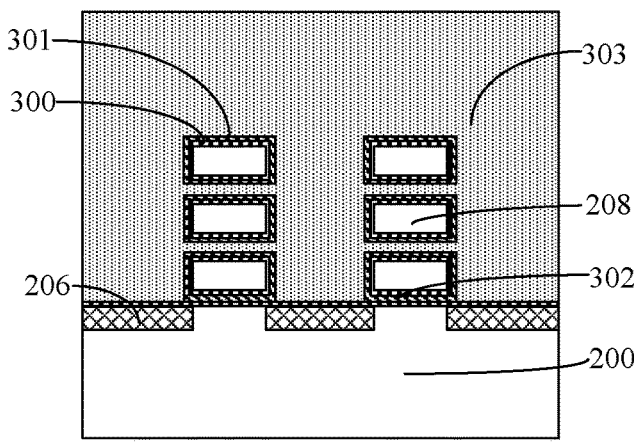

As shown in FIG. 26 which is a top view of the semiconductor structure, FIG. 27 which is a cross-sectional view along a DD1 direction in FIG. 26, and FIG. 28 which is a cross-sectional view along an EE1 direction in FIG. 26, after forming the insulating layers 302, the gates 303 may be formed in the gate openings 214 and the second openings 216. The gate structures may include the gates 303.

The gates 220 may be made of a material including a metal. The metal may include tungsten, copper, gold, or a combination thereof. In the present embodiment, the gates 220 may be made of tungsten.

Another embodiment of the present disclosure shown in FIG. 29 to FIG. 37 provides another fabrication method of a semiconductor structure.

In this embodiment, the method for replacing the first sacrificial layers with the insulating layers is different from the previous embodiments. Specifically, the method for replacing the first sacrificial layers with the insulating layers may include: removing the first sacrificial layers exposed by the gate openings, to form the first openings between the plurality of channel layers and the substrate; and forming the insulating material layer in the first openings and the gate openings, such that the insulating layers are formed from a portion of the insulating material layer in the first openings.

In this embodiment, the first sacrificial layers and the second sacrificial layers may be made of different materials.

The first sacrificial layers 209 and the second sacrificial layers 210 may be made of a material including silicon germanium. The concentration of germanium in the first sacrificial layers 209 may be larger than the concentration of germanium in the second sacrificial layers 210. The germanium concentration in the first sacrificial layers 209 may be about 25% to about 40%, and the germanium concentration in the second sacrificial layers 210 may be about 10% to about 25%. Therefore, in the subsequent etching process for removing the first sacrificial layers 209, the etching process may have a larger etching selectivity on the first sacrificial layers 209 than the second sacrificial layers 210.

Figure 29:
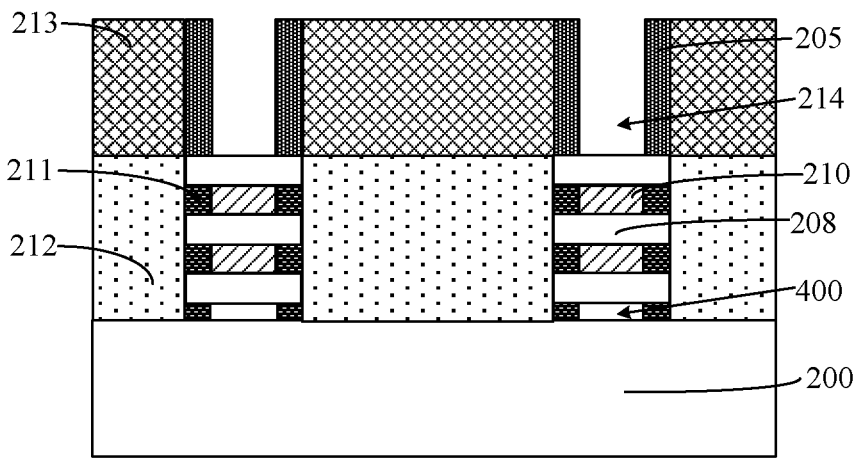
FIGS. 29-37 illustrate cross-sectional views of semiconductor structures corresponding to certain stages of forming another exemplary semiconductor structure according to various disclosed embodiments of the present disclosure.
Figure 30:
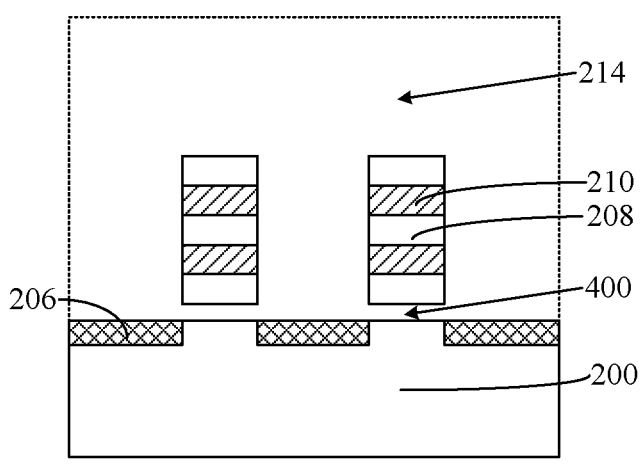

Based on FIG. 12 to FIG. 14, as shown in FIG. 29 whose view angle is same as FIG. 13 and FIG. 30 whose view angle is same as FIG. 14, the first sacrificial layers 209 exposed by the gate openings 214 may be removed to form the first openings 400 between the plurality of channel layers 208 and the substrate 200.

The first sacrificial layers 209 exposed by the gate openings 214 may be removed by a dry etching process, a wet etching process, or a combination thereof. In this embodiment, the first sacrificial layers 209 exposed by the gate openings 214 may be removed by the wet etching process.

The etching selectivity of the first sacrificial layers 209 and the second sacrificial layers 210 in the process of removing the first sacrificial layers 209 exposed by the gate openings 214 may be about 3:1 to about 100:1.

Figure 31:
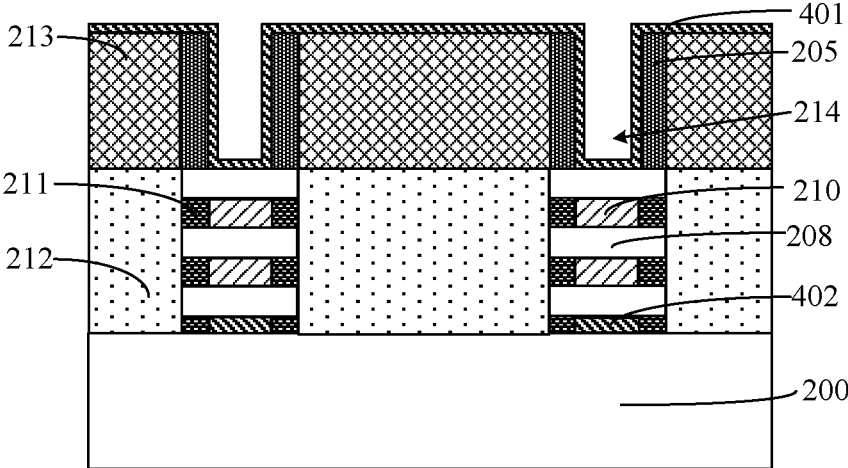
Figure 32:
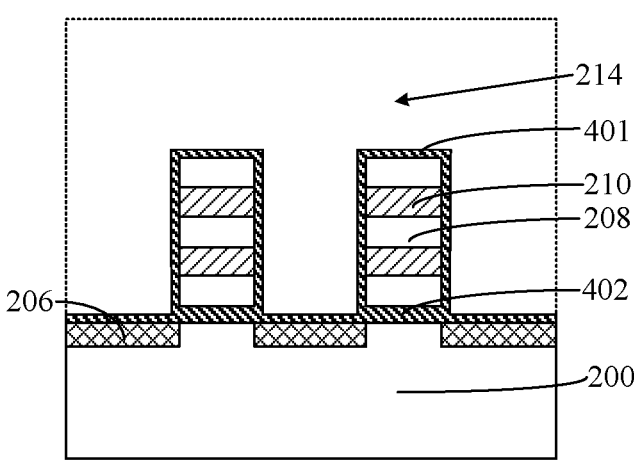

As shown in FIG. 31 whose view angle is same as FIG. 29 and FIG. 32 whose view angle is same as FIG. 30, the insulating material layer 401 may be formed in the first openings 400 and the gate openings 214, such that the insulating layers 402 are formed from a portion of the insulating material layer 401 in the first openings 400.

In this embodiment, the insulating material layer 401 may be made of a material including silicon oxide. In other embodiments, the insulating material layer may be made of a dielectric material, a high-K dielectric material (referring to a dielectric material with a relative permittivity higher than 3.9, such as hafnium oxide), or a combination of the dielectric material and a high-K dielectric material. The dielectric material may include silicon oxide, silicon nitride, silicon carbide, silicon oxycarbide, silicon oxynitride, aluminum oxide, aluminum nitride, silicon carbide nitride, silicon oxycarbide, or a combination thereof.

Figure 33:
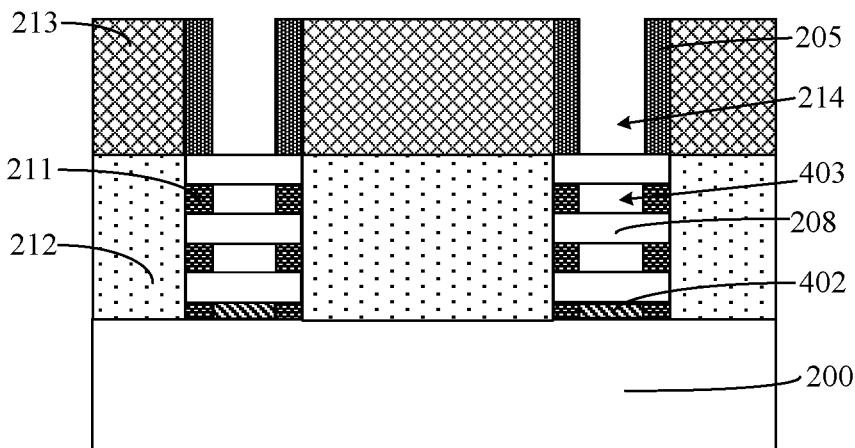
Figure 34:
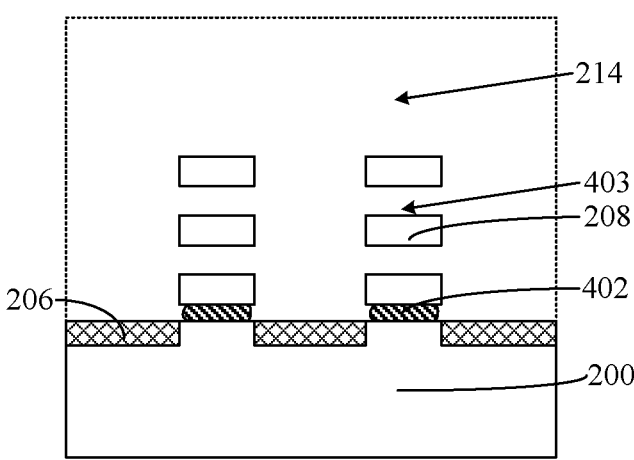

As shown in FIG. 33 whose view angle is same as FIG. 41 and FIG. 34 whose view angle is same as FIG. 32, after forming the insulating layers 402, the insulating material layers 401 in the gate openings 214 may be removed, to expose the surfaces of the plurality of channel layers 208 exposed by the gate openings 214. Then, the second sacrificial layers exposed by the gate openings 214 may be removed to form the second openings 403 between adjacent channel layers 208 and form the plurality of composite layers from the initial composite layer. Each composite layer may include a plurality of channel layers 208 vertically stacked, the first openings 400 between the plurality of channel layers 208 and the substrate 200, and the second openings 403 between adjacent channel layers 208.

The second sacrificial layers 210 exposed by the gate openings 214 may be removed by a dry etching process, a wet etching process, or a combination thereof. In this embodiment, the second sacrificial layers 210 exposed by the gate openings 214 may be removed by the wet etching process.

Since the size of the first openings 400 is smaller than that of the gate openings 214, the insulating material layer 401 in the first openings 400 may be more difficult to remove than the insulating material layer 401 in the gate openings 214, such that the insulating layers 402 may be preserved.

The insulating layers 302 may be disposed between the gates and the substrates 200. The parasitic capacitance between the gates and the substrate 200 may be suppressed, to reduce the turn-on condition and the leakage probability of the bottom parasitic transistor, thereby improving the performance of the device.

In this embodiment, after the etching process of removing the insulating material layer 217 in the gate openings 214 and the second openings 216, the insulating layers 218 may be preserved completely. In other embodiments, the gate oxide layers located on the surfaces of the insulating layers and the gate dielectric layer located on the surfaces of the gate oxide layers may be located in the first openings. That is, after the etching process of removing the insulating material layer 217 in the gate openings 214 and the second openings 216, the insulating layers may be preserved partially. In the subsequent forming process of the gate oxide layers and the gate dielectric layers, the materials of the gate oxide layers and the gate dielectric layers may fill the first openings, and play the same role as the insulating layers. The shape of the insulating layers may be related to the etching process of removing the insulating material layer 217 in the gate openings 214 and the second openings 216.

Figure 35:
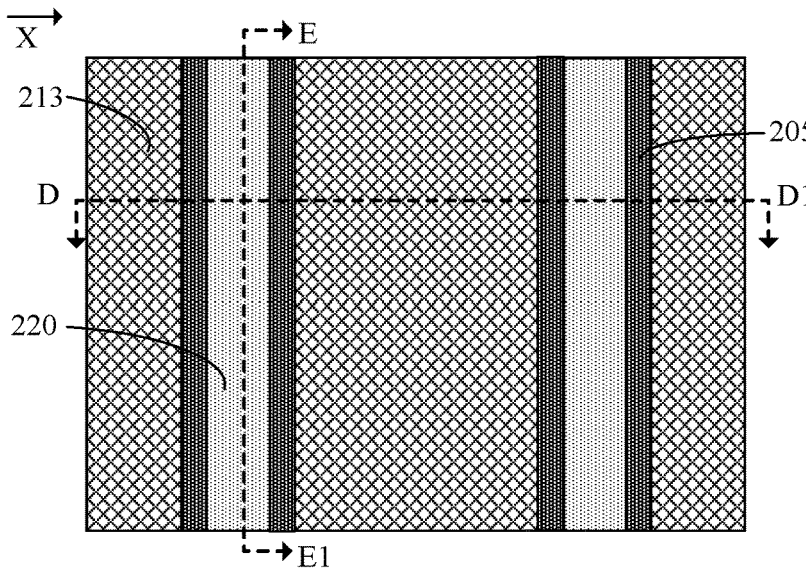
Figure 36:
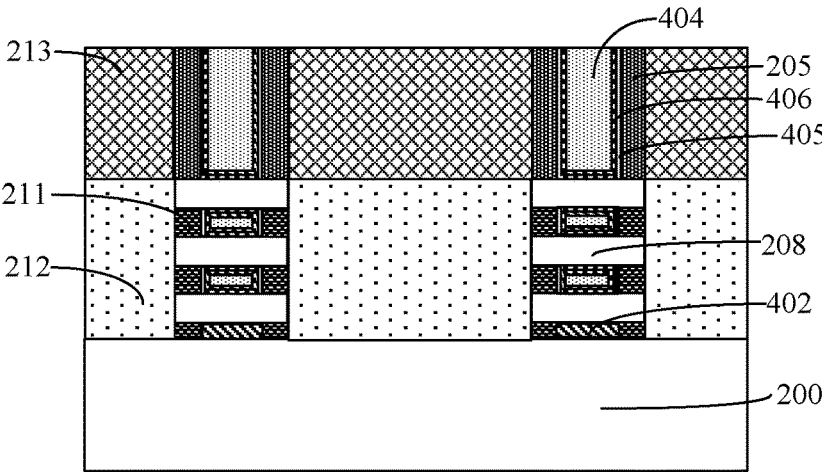
Figure 37:
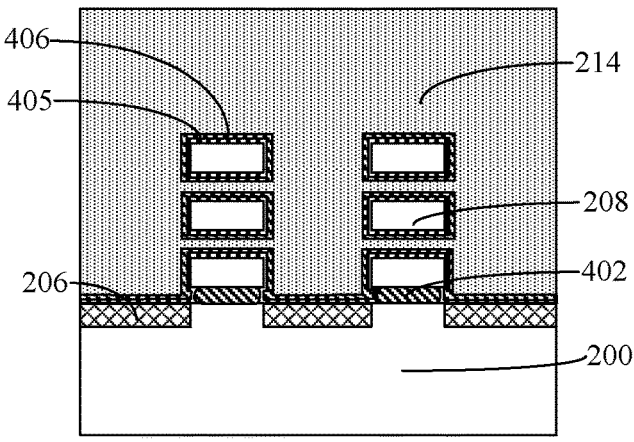

As shown in FIG. 35 which is a top view of the semiconductor structure, FIG. 36 which is a cross-sectional view along a DD1 direction in FIG. 35, and FIG. 37 which is a cross-sectional view along an EE1 direction in FIG. 35, the gates 220 may be formed in the gate openings 214 and the second openings 216. The gate structures may include the gates 220.

In one embodiment, each gate structure may include a gate oxide layer 405 and a gate dielectric layer 406 located on the surface of the gate oxide layer 405, and the gate 404 may be located on the surface of the gate dielectric layer 406.

In this embodiment, the gate oxide layers 405 on the surface of the insulating layers 402 and the gate dielectric layers 406 on the surface of the gate oxide layers 405 may be also located in the first openings.

The gates 220 may be formed by: forming a gate material layer on the surface of the interlayer dielectric layer 213, in the gate openings 214 and the second openings 216; and planarizing the gate material layer until exposing the surface of the interlayer dielectric layer 213.

The present disclosure also provides another semiconductor structure. As shown in FIG. 35 to FIG. 37, in one embodiment, the semiconductor structure may include: a substrate 200; a plurality of composite layers; gate structures crossing the plurality of composite layers; inner spacers 211; insulating layers 402; and source/drain layers 212. Each composite layer may extend along a first direction X. Each of the composite layers may include a plurality of channel layers 208 stacked along a direction perpendicular to the surface of the substrate. There may be first openings between the plurality of channel layers 208 and the substrate 200, and second openings 403 between adjacent channel layers 208. In the direction perpendicular to the surface of the substrate 200, the first openings 400 may have a first size, and the second openings 403 may have a second size. The first size may be smaller than the second size. The gate structures may include gates 220, and may be located on a portion of the sidewall surfaces and the top surfaces of the plurality of composite layers. The gate structure may be also located in the second openings 216 and surround the plurality of channel layers 208. The inner spacers 211 may be located between the plurality of channel layers 208 and the substrate 200, and between adjacent channel layers 208. The inner spacers 211 may be also located on the sidewalls of the gates 404. The source/drain layers 212 may be located in the plurality of composite layers at two sides of each gate structure. Sidewalls of the source/drain layers 212 may be coplanar with the sidewalls of the adjacent inner spacers 211 and the end surfaces of the adjacent channel layers 208. The insulating layers 402 may be located in the first openings 400.

The insulating layers 402 may be disposed between the gates and the substrates 200. The parasitic capacitance between the gates and the substrate 200 may be suppressed, to reduce the turn-on condition and the leakage probability of the bottom parasitic transistor, thereby improving the performance of the device.

In one embodiment, the semiconductor structure may further include: an interlayer dielectric layer 213 located on the substrate 200, on the surfaces of the plurality of composite layers, and on the sidewalls of the gate structures.

In one embodiment, each of the gate structures may include a gate oxide layer (not shown in the figure), and a gate dielectric layer 219 located on the surface of the gate oxide layer. The gates 220 may be located on the surfaces of the gate dielectric layers 219.

In this embodiment, the gate oxide layers 405 on the surface of the insulating layers 402 and the gate dielectric layers 406 on the surface of the gate oxide layers 405 may be also located in the first openings 400.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
a composite layer over a substrate, wherein the composite layer includes a plurality of channel layers stacked along a vertical direction with respect to the substrate;
a gate structure formed over a bottom channel layer of the plurality of channel layers and around each of other channel layers of the plurality of channel layers;
first inner spacers formed on sides of a first portion of the gate structure between adjacent channel layers; and
an isolation structure formed between the bottom channel layer and the substrate, wherein the isolation structure includes an insulating layer sandwiched between second inner spacers formed between the bottom channel layer and the substrate.

2. The structure according to claim 1, further comprising:
an interlayer dielectric layer located on the substrate, on a top surface of the composite layer, and on sidewalls of the gate structure.

3. The structure according to claim 1, further comprising:
a gate oxide layer and a gate dielectric layer on a surface of the gate oxide layer, wherein the gate structure includes a gate located on a surface of the gate dielectric layer.

4. The structure according to claim 3, wherein:
the gate oxide layer and the gate dielectric layer are further located on the insulating layer.

5. A fabrication method of a semiconductor structure, comprising:
providing a substrate;
forming a composite layer on the substrate, wherein the composite layer includes a plurality of channel layers stacked along a vertical direction with respect to the substrate;
forming a gate structure over a bottom channel layer of the plurality of channel layers and around each of other channel layers of the plurality of channel layers;
forming first inner spacers on sides of a first portion of the gate structure between adjacent channel layers; and
forming an isolation structure between the bottom channel layer and the substrate, wherein the isolation structure includes an insulating layer sandwiched between second inner spacers formed between the bottom channel layer and the substrate.

6. The structure according to claim 1, wherein:

in the vertical direction, the insulating layer has a first size, and a portion of the gate structure between adjacent channel layers has a second size, wherein the first size is smaller than the second size.

7. The structure according to claim 1, wherein:

the gate structure is located on a portion of surfaces of sidewalls and a top surface of the composite layer, and is also located between adjacent channel layers and surrounds the plurality of channel layers.

8. The structure according to claim 1, wherein:

the first inner spacers are located between adjacent channel layers, and the second spacers are located between the bottom channel layer and the substrate.

9. The structure according to claim 8, wherein:

the first inner spacers are further located on sidewalls of the gate structure between adjacent channel layers.

10. The structure according to claim 8, further comprising a source/drain layer, wherein the source/drain layer is located in the composite layer on two sides of the gate structure.

11. The structure according to claim 10, wherein side walls of the source/drain layer are coplanar with sidewalls of adjacent first inner spacers and end faces of adjacent channel layers.

12. The structure according to claim 1, wherein the insulating layer is made of silicone oxide.

13. The structure according to claim 1, wherein the insulating layer is made of a dielectric material with a relative permittivity higher than 3.9.

14. The structure according to claim 1, wherein the insulating layer is made of silicon nitride, silicon carbide, silicon oxycarbide, silicon oxynitride, aluminum oxide, aluminum nitride, silicon carbide nitride, silicon oxycarbide, or a combination thereof.

15. The structure according to claim 3, wherein the insulating layer includes the gate oxide layer and the gate dielectric layer.

16. The structure according to claim 1, further comprising an isolation layer formed in the substrate.

17. The structure according to claim 1, wherein the first inner spacers and the second inner spacers are aligned with each other along the vertical direction.

18. The structure according to claim 1, wherein the first portion of the gate structure between the adjacent channel layers are aligned with the insulating layer between the bottom channel layer and the substrate along the vertical direction.

19. The structure according to claim 1, wherein along the vertical direction, a sidewall surface of the first portion of the gate structure between the adjacent channel layers is coplanar with a corresponding sidewall surface of the insulating layer of the isolation structure between the bottom channel layer and the substrate.

20. The structure according to claim 1, further comprising a source/drain layer at least located on each side of the isolation structure over the substrate.

* * * * *